United States Patent [19]

Engle

[11] 4,433,304
[45] Feb. 21, 1984

[54] AUTOMATIC NOISE REJECTION FOR USE IN SCANNER AND THE LIKE

[75] Inventor: Gary L. Engle, Fair Oaks, Calif.

[73] Assignee: General Electric Company, Rancho Cordova, Calif.

[21] Appl. No.: 294,159

[22] Filed: Aug. 19, 1981

[51] Int. Cl.³ .................................................. H03G 3/10
[52] U.S. Cl. ...................................... 330/281; 330/129
[58] Field of Search ........................ 330/129, 278, 281

[56] References Cited

U.S. PATENT DOCUMENTS

| | | | |
|---|---|---|---|
| 4,066,977 | 1/1978 | Chambers et al. | 330/129 |
| 4,292,598 | 9/1981 | Yasumura | 330/281 |
| 4,360,787 | 11/1982 | Galpin | 330/129 |

Primary Examiner—James B. Mullins
Assistant Examiner—Gene Wan
Attorney, Agent, or Firm—Flehr, Hohbach, Test, Albritton & Herbert

[57] ABSTRACT

In a system such as an ultrasonic scanner in which a signal must be variably amplified with time in response to a time gain control (TGC) signal, automatic noise rejection is provided by periodically comparing amplified noise with a threshold value above which noise interferes with signal analysis. TGC signal control of a variable amplifier is permitted so long as the amplified noise is less than the threshold value. A maximum control voltage, $V_n$, is applied to the variable amplifier when the amplified noise exceeds the threshold level.

7 Claims, 6 Drawing Figures

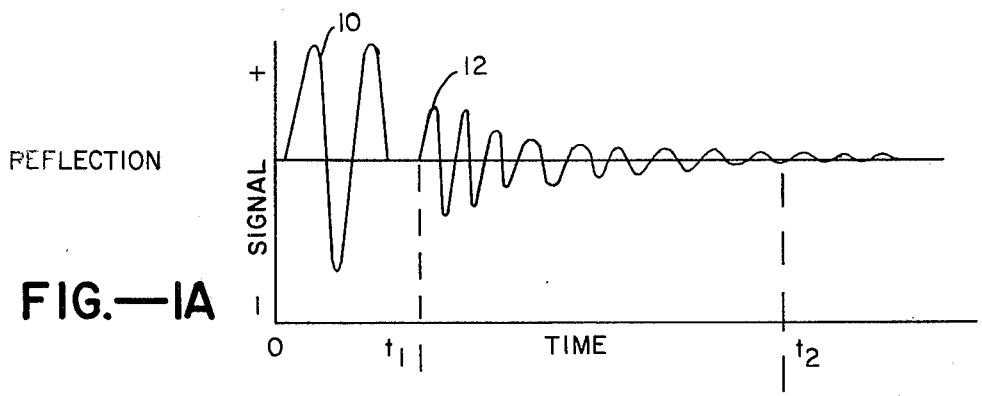
FIG.—1A
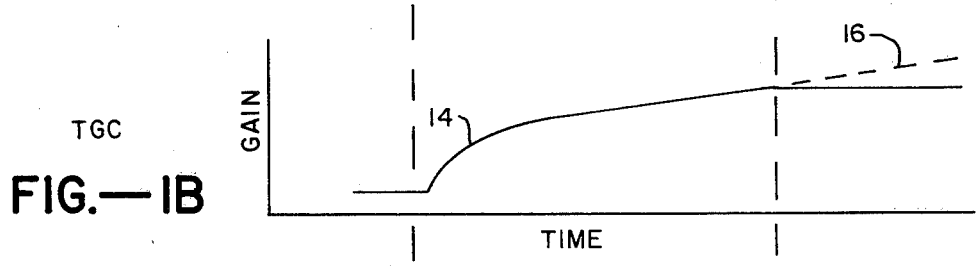
FIG.—1B
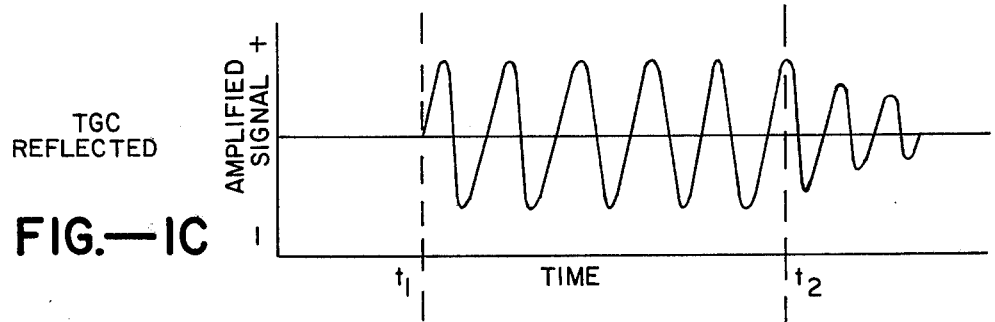
FIG.—1C
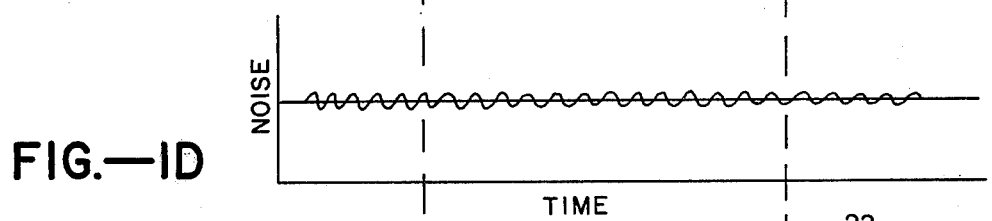
FIG.—1D
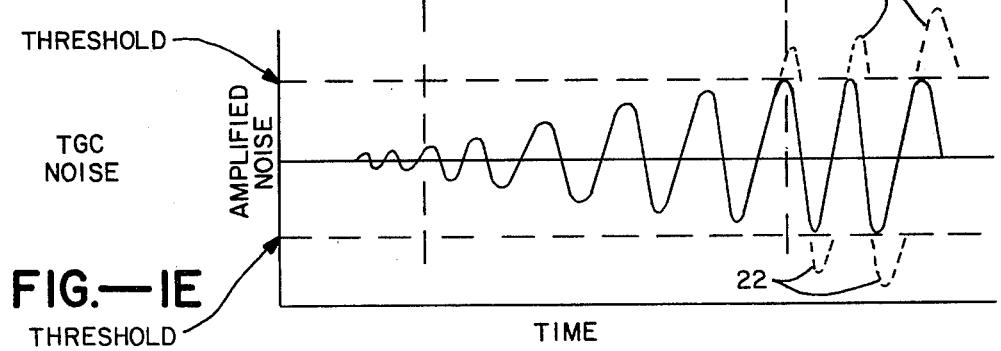
FIG.—1E

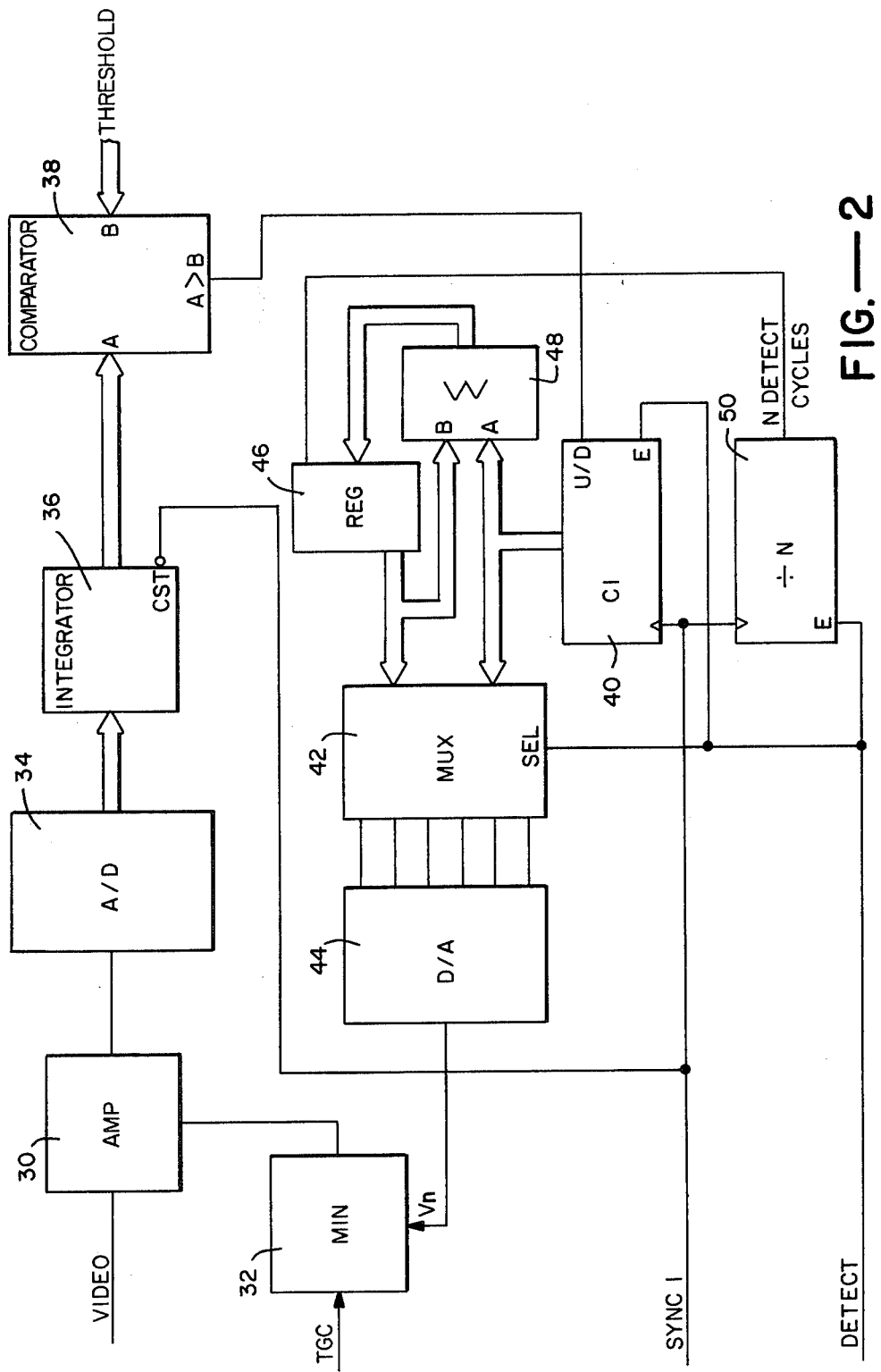

AUTOMATIC NOISE REJECTION FOR USE IN SCANNER AND THE LIKE

This invention relates generally to electrical apparatus employing time gain compensation in signal reception and analysis, and more particularly the invention relates to automatic noise rejection in generating a time gain compensation control signal.

Ultrasonic diagnostic systems are known and commercially available for diagnostic purposes. See for example U.S. Pat. No. 4,172,368 for "Video A Trace Display System For Ultrasonic Diagnostic System" and U.S. Pat. No. 4,204,433 for "Computerized Ultrasonic Scanner With Technique Select". The commercially available Datason ultrasound system of General Electric Company provides both real time and static images on a television display.

Briefly, such systems utilize sound transducers to transmit ultrasonic (e.g. on the order of several megahertz) waves into a patient and to receive echo signals. In one mode of operation, the transducer is attached to a plurality of hinged arms for movement in a single plane, and potentiometers associated with the hinged arms produce signals which identify the transducer position. Alternatively, a transducer array or a hand held transducer can be used. The echo signals are applied to a time gain compensated amplifier to adjust the echo signals for attenuation in passing through the patient. The adjusted signals are then passed through an analog to digital conversion and video processing circuitry and thence to scan converter circuitry for display formatting. The display comprises a plurality of pixels in horizontal rows and vertical columns with each pixel having a brightness level in response in the input signal. Conventionally, the brightness is defined by a 32 level Grayscale, hence the pixel brightness level requires a five bit digital code.

The control signal for the time gain compensated amplifier can be generated by combining analog signal components to effect the desired amplifier response. However, accuracy of control is limited in said systems, and the code parameters cannot be revised easily once defined in hardware. Moreover, transducers have different response characteristics which must be accounted for in the time gain compensated amplifier. Accordingly, resolution is limited in using the analog signals.

The Datason system of General Electric Company uses digital circuitry for generating and storing a time gain compensation signal. The circuitry is disclosed in copending application Ser. No. 203,661, filed Nov. 3, 1980. In this system a digital code indicative of desired amplifier gain is stored in a first memory. A second digital code indicative of a particular transducer response, can be combined with the first digital code. The stored code is applied through a digital to analog converter to generate a time gain control voltage for a variable gain amplifier.

The time gain control is provided to compensate for signal attenuation with time. However, most ultrasonic imaging systems include a noise reject adjustment. These adjustments operate differently in different systems but the basic concept is to eliminate noise from the image when the time gain control signal reaches a threshold level at which amplifier noise appears on the display. Typically, this adjustment is made as a compromise at best because every system will have different noise characteristics and each transducer will also have different noise pickup characteristics.

Accordingly, an object of the present invention is an improved scanning system with automatic noise rejection provided therein.

Another object of the invention is means for providing automatic noise rejection in the time gain compensation signal.

Still another object of the invention is a method of automatically compensating for noise in generating a time gain control signal for use in an ultrasonic scanner.

Briefly, in a system employing time gain compensation for variably amplifying a signal in response to a gain control signal, automatic noise rejection means is provided for adjusting the time gain control signal when amplified noise exceeds a threshold value. The automatic noise rejection means includes means for receiving and comparing a time gain amplified noise signal with a threshold value, and means for adjusting the time gain control voltage when the time gain amplified noise exceeds the threshold.

More specifically, the means for adjusting the time gain control voltage includes counter means responsive to a comparison signal derived in response to comparison of the time gain amplified noise and the threshold value for producing an increasing count when the amplified noise is less than the threshold and a decreasing count when the amplified noise is greater than the threshold. A second comparator means is provided for receiving and comparing an established time gain control signal and a signal derived from said counter means. The output of the second comparator means, corresponding to the lesser value of the two signals applied to the second comparator means, is then applied as an adjusted time gain control signal with automatic noise rejection.

The invention and objects and features thereof will be more readily apparent from the following detailed description and appended claims when taken with the drawing, in which:

FIG. 1A is a graph illustrating a transmitted signal and a reflected signal versus time.

FIG. 1B is a graph illustrating a time gain control signal versus time.

FIG. 1C is a graph illustrating a reflected signal as amplified in response to a time gain control signal.

FIG. 1D is a graph illustrating noise versus time.

FIG. 1E is a graph illustrating amplified noise versus time.

FIG. 2 is a functional block diagram of one embodiment of a time gain control amplification system in accordance with the invention.

Referring now to the drawings, FIGS. 1A–1E illustrate the operation of a time gain control amplification system with noise rejection in accordance with the invention. The description will be in conjunction with an ultrasonic scanner in which a pulse is generated and a reflected signal is received in response thereto. In FIG. 1A the pulse 10 is generated at time t0 by an ultrasonic transducer, for example. Thereafter, beginning at time t1 a reflected signal 12 is received by the transducer which is attenuated with time as illustrated. In order to analyze the reflected signal 12 the signal is passed through a variable gain amplifier in which the gain is controlled by time gain control signal such as the signal 14 in FIG. 1B. As shown, the time gain control signal begins increasing after time t1 to compensate for the decreasing amplitude of the attenuated reflected signal 12. The effective result is the amplified signal 12 shown in FIG. 1C in which the magnitude of the reflected signal 12 is essentially constant over time between the time periods t1 and t2.

The time gain control signal 14 in FIG. 1B rises from time t1 to the time t2 at which point the control signal remains constant. If the time gain control signal were to continue upwardly, as illustrated by the dotted line 16 in FIG. 1B, noise picked up by the receiving transducer is amplified to such an extent as to interfere with the received signal. For example, on a video display spikes of noise are present and the picture on the display is distorted. Thus, at time, t2, the amplitude of the attenuated signal 12 decreases to a level where the noise magnitude is significant. This is illustrated in FIGS. 1D and 1E which show the effect of the variable gain amplification on the noise with time. In FIG. 1D the noise signal 20 has a relatively low, constant magnitude. However, as shown in FIG. 1E the magnitude of the amplified noise increases with time, in response to the time gain control signal, and at the time t2 threshold levels of the amplified noise would be exceeded if the time gain control signal continued in magnitude. This is illustrated by the noise spikes 22 which exceed the threshold level. Accordingly, by limiting the magnitude of the time gain control signal after time t2 the noise level can be maintained within the threshold levels and will not interfere with viewing of the amplified reflected signal on a video screen.

As above described, in most conventional scanner systems the maximum light of the time gain control signal is made as a compromise at best since every system has different and time-varying noise characteristics and each transducer in the system may have different noise pickup characteristics. Accordingly, the time gain control signal may be unduly limited in some systems while in other systems undue noise amplification is permitted.

In accordance with the present invention automatic noise rejection is achieved by providing means for periodically adjusting the gain control signal in accordance with system noise. FIG. 2 is a functional block diagram of one circuit embodiment of the invention. Conventionally, a reflected video signal is applied through a variable gain amplifier 30 with the amplification of amplifier 30 being controlled by a time gain control signal (TGC). In this embodiment the TGC signal is periodically compared with a voltage $V_n$ in a comparator 32 with comparator 32 passing the lower of the two signals. Thus, by establishing a noise voltage reference, $V_n$, at which noise exceeds a threshold value, the TGC signal cannot exceed this voltage level.

For effecting the automatic noise rejection only noise in the video line is passed to amplifier 30. The circuitry includes an analog to digital converter 34 and an integrator 36 which are connected to receive and integrate the amplified noise signal at the output of amplifier 30 during one receiving cycle (e.g. between t1 and t2 in FIGS. 1A–1E). The integrated signal is then applied to a comparator 38 which compares the integrated value with a pre determined noise threshold voltage level.

The output of comparator 38 is applied to the up-down control terminal of a counter 40 whereby the count is incremented so long as the integrated value is less than the threshold level. When the integrated value exceeds the threshold level then the count in counter 40 is decremented. The output of counter 40 is provided through mulitplexer (MUX) 42 to digital to analog converter 44 as the noise reference voltage, $V_n$. Thus, the incrementing count of counter 40 increases the value of the $V_n$ signal and accordingly, the TGC signal can continue to increase.

When comparator 38 indicates that the integrated value of the amplified noise is greater than the threshold value, then counter 40 is decremented. Accordingly, the voltage $V_n$ applied to comparator 32 is decreased and the TGC signal is limited to this decreased $V_n$ level.

The output of counter 40 is averaged in summer 48 with a previous value stored in register 46. The new averaged value is then restored in register 46. Thereafter, the value in register 46 can be applied through MUX 42 for establishing $V_n$ when the scanning system is operating.

The automatic noise reject circuitry operates in response to a SYNC 1 signal which normally triggers the pulse from the transducer of the scanning system. SYNC 1 resets counter 40, timer 50, and integrator 36. Thereafter, the echo detect signal (DETECT) is applied to activate MUX 42 and enable the timer 50 which reloads register 46 after a predetermined time period.

Automatic noise reject adjustment in accordance with the present invention enables scanning apparatus to operate at maximum time gain control without noise interference. While the invention has been described with reference to a specific embodiment, the description is illustrative of the invention and is not to be considered as limiting the invention. For example, the method can be implemented in either hardware, as described, or in software. Thus, various modifications and applications may occur to those skilled in the art without departing from the true spirit and scope of the invention as defined by the appended claims.

What is claimed is:

1. Circuitry for variably amplifying a signal in response to a time gain control signal and in which noise rejection is provided comprising
   a variable gain amplifier including an input terminal for receiving an input signal, a control terminal for receiving a time gain control signal, and an output for an amplified signal,
   first comparator means having first and second input terminals for receiving two signals for comparison and an output terminal for providing a comparison signal,
   first means for receiving an amplified signal from said output of said variable gain amplifier and providing a first signal to said first terminal of said first comparator means,
   second means for applying a threshold voltage to said second input of said comparator means,
   counter means responsive to a comparison signal at said output terminal of said comparator means,
   second comparator means having first and second input terminals for receiving two signals for comparison and an output terminal for receiving one of said two signals in response to the comparison,
   third means for applying an established time gain control signal to said first input of said second comparator means,
   fourth means for applying a signal derived from said counter means to said second input of said second comparator means, and
   fifth means for applying a signal at said output terminal of said second comparator means to said control terminal of said variable gain amplifier.

2. Circuitry as defined by claim 1 wherein said first means comprises integrator means for integrating said amplified signal over a period of time.

3. Circuitry as defined by claim 2 wherein said fourth means comprises a digital to analog converter.

4. Circuitry as defined by claim 1, 2, or 3 and further including storage means for storing a count; averaging means for receiving and averaging the count from said storage means and the output of said counter means, and applying the average of said count and said output to said storage means; said fourth means comprising said storage means.

5. In a system employing time gain compensation for variably amplifying a signal in response to a time gain control signal, automatic noise rejection means comprising means for receiving and comparing time gain amplified noise with a threshold value, and means for adjusting said time gain control signal when said time gain amplified noise exceeds said threshold, said means for adjusting said time gain control voltage comprising counter means responsive to a comparison signal and generating a count, second comparator means having first and second input terminals for receiving two signals for comparison and an output terminal for receiving one of said two signals in response to the comparison, first means for applying an established time gain control signal to said first input of said second comparator means, second means for applying a signal derived from the count from said counter means, and third means for applying a signal at the output terminal of said second comparator means as a gain control signal to a variable gain amplifier.

6. Automatic noise rejection means as defined by claim 5 wherein said second means comprises a digital to analog converter.

7. Automatic noise rejection means as defined by claim 5 or 6 and further including storage means for storing a count, averaging means for receiving and averaging the count from said first storage means and the output of said counter means and applying the average of said count and said output to said storage means, said fourth means comprising said storage means.

* * * * *